United States Patent [19]
Takeuchi

[11] Patent Number: 5,898,614
[45] Date of Patent: Apr. 27, 1999

[54] NON-VOLATILE SEMICONDUCTOR MEMORY DEVICE

[75] Inventor: Nobuyoshi Takeuchi, Tokyo, Japan

[73] Assignee: NKK Corporation, Japan

[21] Appl. No.: 08/861,033

[22] Filed: May 21, 1997

Related U.S. Application Data

[63] Continuation-in-part of application No. 08/565,168, Nov. 30, 1995, Pat. No. 5,684,739.

[30]     Foreign Application Priority Data

| Nov. 30, 1994 | [JP] | Japan | 6-296304 |
| Apr. 27, 1995 | [JP] | Japan | 7-103657 |
| Oct. 26, 1995 | [JP] | Japan | 7-279107 |
| May 1, 1997 | [JP] | Japan | 9-113874 |

[51] Int. Cl.$^6$ ................................................. G11C 7/00
[52] U.S. Cl. ............................ 365/185.1; 365/185.05; 365/185.07
[58] Field of Search ................ 365/185.01, 185.05, 365/185.06, 185.07, 185.1, 210; 257/316, 317

[56]     References Cited

U.S. PATENT DOCUMENTS

| 4,649,520 | 3/1987 | Eitan | 365/185.1 |
| 4,661,833 | 4/1987 | Mitzutani | 365/185.1 |
| 5,465,231 | 11/1995 | Ohsaki | 365/185.1 |
| 5,622,881 | 4/1997 | Acocella et al. | 365/185.1 |

*Primary Examiner*—Vu A. Le
*Attorney, Agent, or Firm*—Nixon & Vanderhye

[57]     ABSTRACT

A non-volatile semiconductor memory device comprises a plurality of memory cells each including a semiconductor substrate of a first conductivity type having a main surface region, a control gate portion formed in said main surface region of the semiconductor substrate and consisting of an impurity diffusion region of a second conductivity type opposite to said first conductivity type, a reading transistor portion formed on the main surface region of the substrate and consisting of a MOS type transistor structure, and a floating gate portion formed over the control gate portion and the reading transistor portion. These memory cells differ from each other in an overlapping area ratio Ap/An, where An denotes an area of an over-lapping portion between the floating gate and the impurity diffusion region of the control gate portion, Ap represents an area of an overlapping portion between the floating gate and an active region of the reading transistor portion.

5 Claims, 10 Drawing Sheets

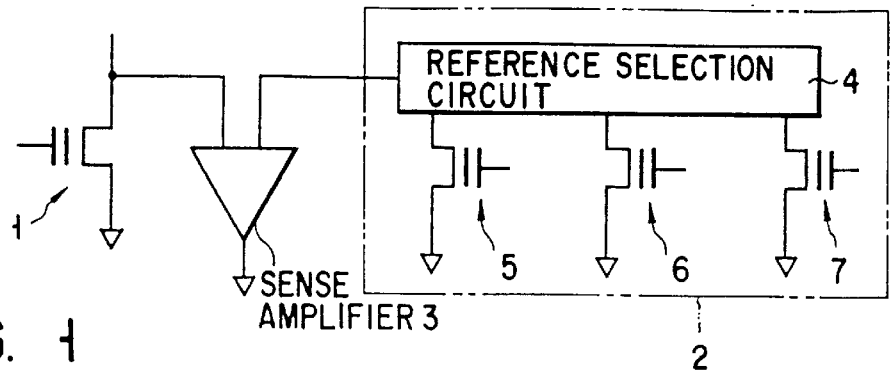
F I G. 1
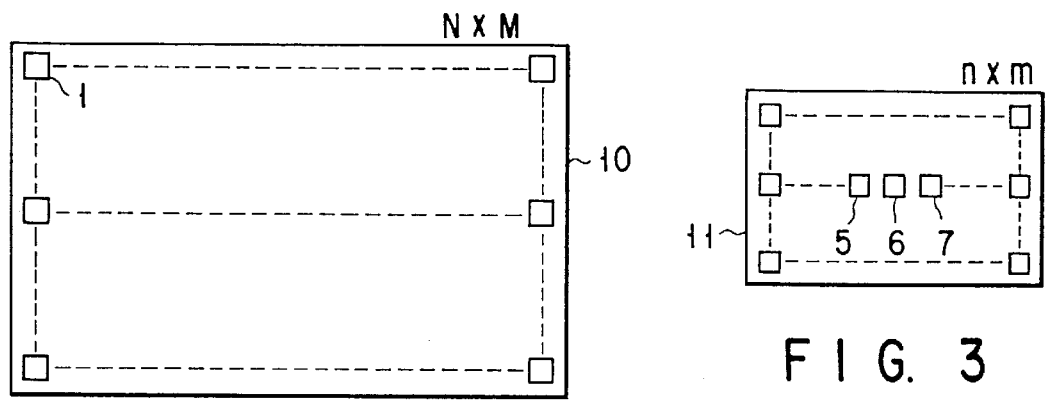
F I G. 2
F I G. 3
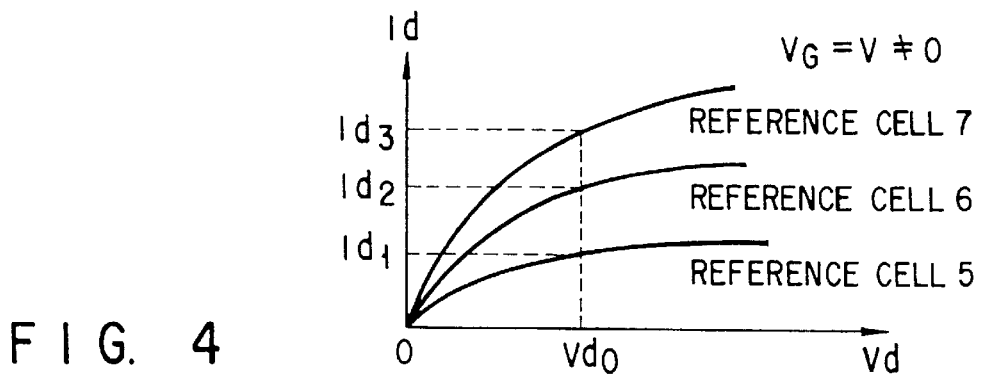
F I G. 4
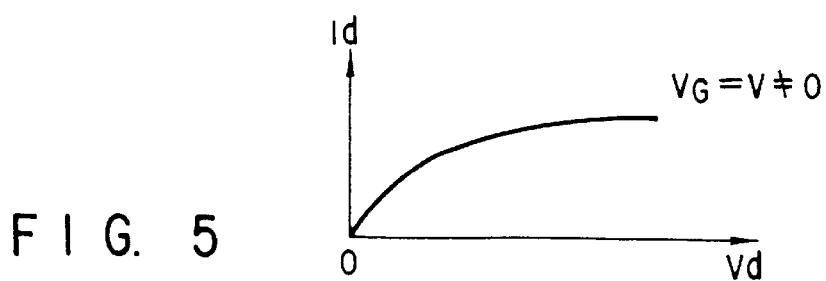
F I G. 5

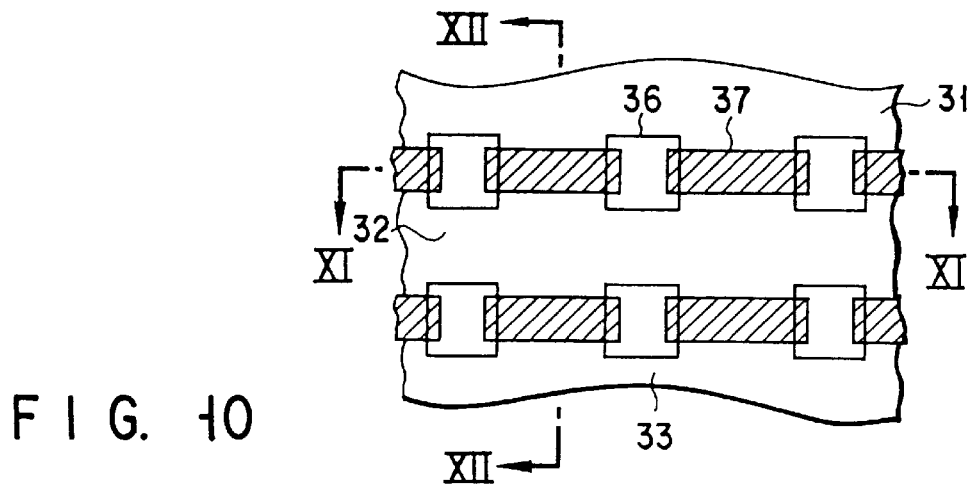
F I G. 10
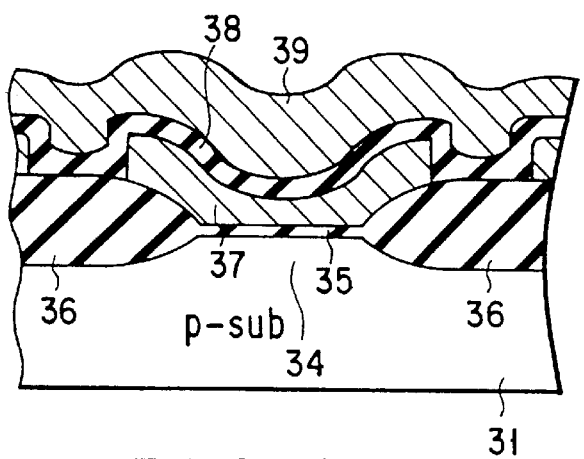
F I G. 11
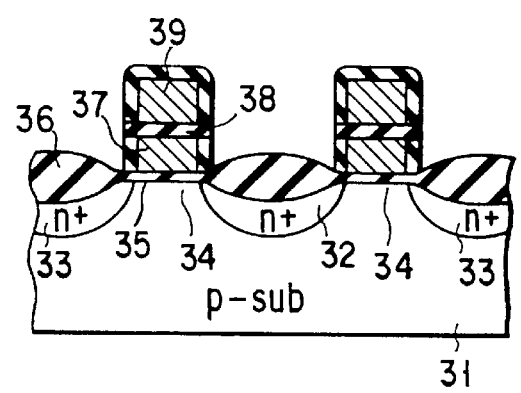
F I G. 12
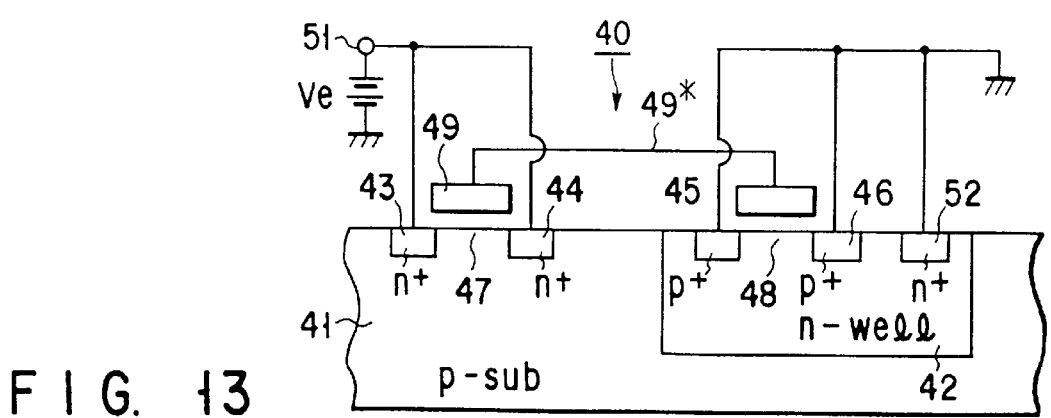
F I G. 13

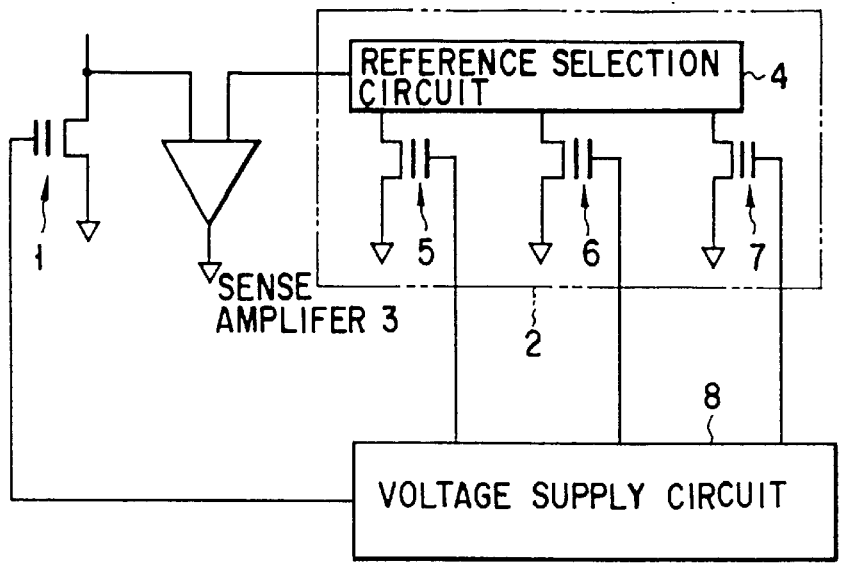
F I G. 15
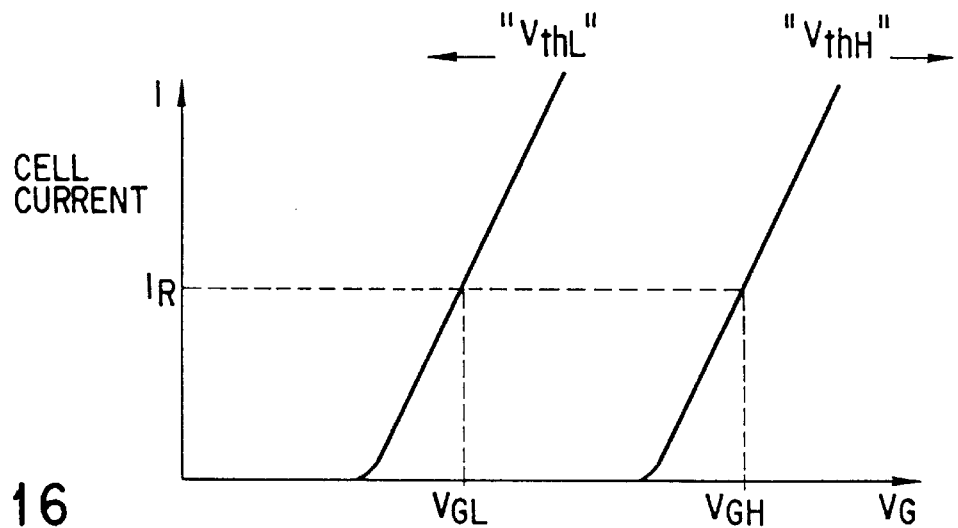
F I G. 16
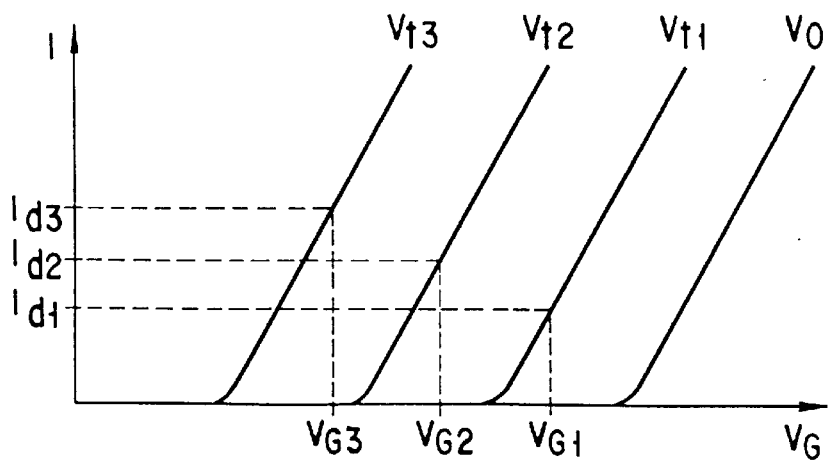
F I G. 17

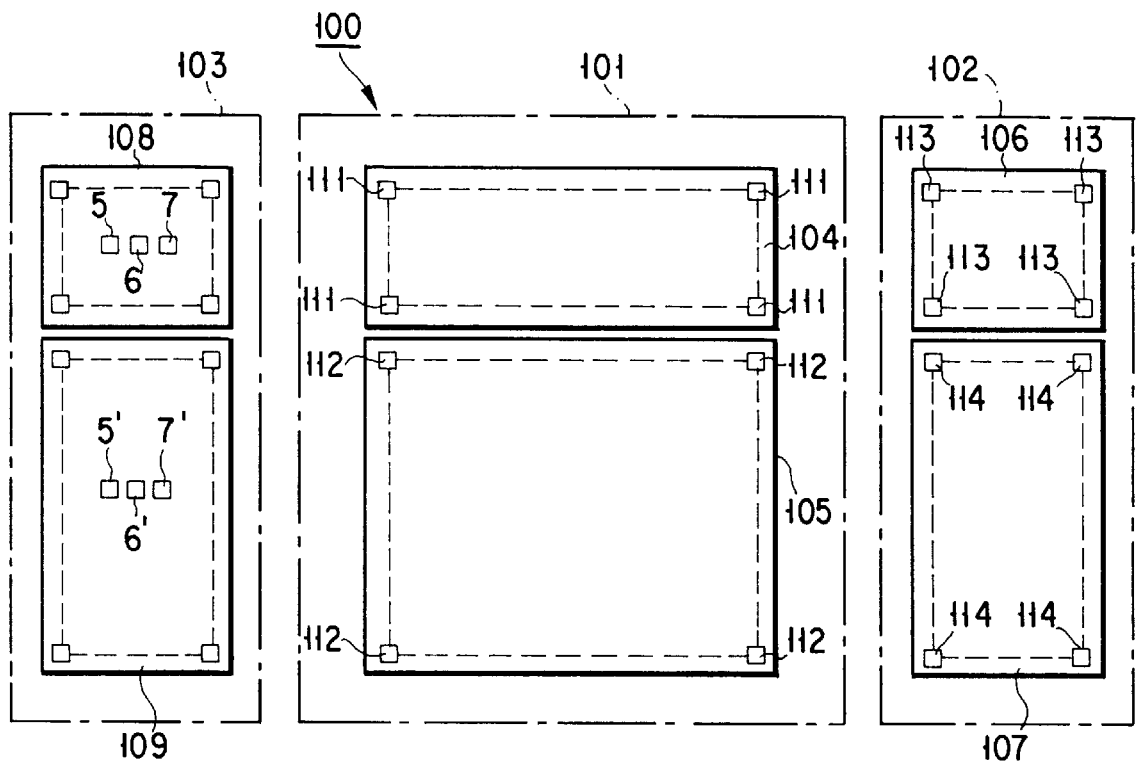
F I G. 20
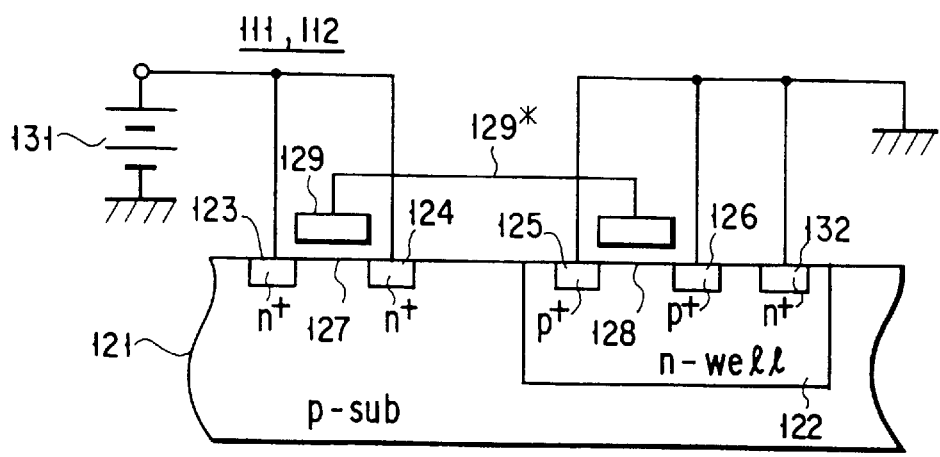
F I G. 21

NON-VOLATILE SEMICONDUCTOR MEMORY DEVICE

CROSS-REFERENCE TO RELATED APPLICATIONS

This application is a continuation-in-part of U.S. patent application No. 08/565,168, field Nov. 30, 1995 U.S. Pat. No. 5,684,739.

BACKGROUND OF THE INVENTION

The present invention relates to a semiconductor device. More specifically, the present invention relates to a non-volatile semiconductor memory device.

In a floating gate type non-volatile semiconductor memory device, a current flowing in a cell under predetermined conditions and a current flowing to a reference transistor are compared by a differential amplifier so as to determine cells in an array by "0" and "1". This reference transistor is called reference cell.

Such a reference cell is generally formed to have the same structure as that of an array cell for the purpose of maintaining a similarity with respect to the cell in array, or into a so-called dummy cell type in which the control gate and the floating gate are connected to each other. In short, a reference cell array serves as a miniature version of cell array.

Also, in a reference which determines an output of a logic device, the reference level is generally limited to the threshold value of the transistor used in the logic device.

Recently, in accordance with diversification in the characteristics of devices, it becomes necessary to make determination in terms of "0", "0.5" and "1" as in the case of, for example, a multi-value memory.

With a conventional approach, in reply to such a demand, a plurality of sense amplifiers having different sense ratios are used to deal with the diversification of devices, that is, a multiplicity in value.

However, with this approach, the circuit area is increased, thereby increasing the chip area and the cost.

For verification in which the threshold value of the memory cell after programming or erase is confirmed, the non-volatile semiconductor memory device changes its verifying voltage in accordance with the state to be verified. However, when a verification is carried out in the above-mentioned manner, the voltage supply circuits are inevitably complicated.

A memory cell can be defined as a circuit of a minimum unit, for storing data in a semiconductor memory device. A memory cell consists of a transistor and a capacitor in combination. A normal semiconductor memory device is required to achieve as small distribution of memory data as possible, its memory cell array consists of a plurality of memory cells of the same type and the same size, so as to obtain as uniform characteristics as possible.

In accordance with an increase in the degree of integration of a semiconductor memory device, there is a tendency for a semiconductor memory device to be required to have not only a function as a mere memory medium but also a function of systematic operation coupled with a CPU. Such a tendency is particularly prominent in a non-volatile semiconductor memory device such as an EPROM, EEPROM or flash memory.

In reply to such requirements, it is proposed that a memory cell array of a semiconductor memory device is divided into a plurality of blocks, which are allowed to have different functions from each other, for example, as inn a bootblack mode of Intel Co. In this mode, the blocks have different functions from each other, and therefore the characteristics required from memory cells are different from one block to another. More specifically, a block in which a basic code such as for standing a system is input, involves a less number of times of rewriting of data, and therefore is required to have memory cells of a mask ROM type, whereas a block in which data is frequently rewritten, requires to have memory cells having excellent programming characteristics.

However, in a conventional semiconductor memory device, a memory cell array consists of memory cells which have the same characteristics. Consequently, a variety of requests as mentioned above cannot be satisfied. In the case where memory cells are formed to have the characteristics suitable for one block, these memory cells may cause a trouble in another block. For example, in the case where all the memory cells of a memory cell array is formed to have a large gate couple ratio, so as to improve the programming characteristics, those memory cells which belong to a block used for inputting a basic code are easily exposed to problems such as gate-disturb and soft-write.

BRIEF SUMMARY OF THE INVENTION

An object of the present invention is to provide a semiconductor device which permits forming transistor structures differing from each other in threshold value within a single device for diversification of the purposes of the device.

Another object is to provide a non-volatile semiconductor memory device which permits exhibiting different functions satisfactorily.

According to a first aspect of the present invention, there is provided a semiconductor device, comprising:

a semiconductor substrate having a main surface region; and a plurality of cells formed in said main surface region of the substrate;

wherein each cell is formed of first and second MOS transistors each including an active region formed in the main surface region, a gate oxide film formed on the main surface, and a gate portion formed on said gate oxide film, said active region of the first MOS transistor being electrically insulated from said active region of the second MOS transistor, and said gate portion of the first MOS transistor being electrically connected to said gate portion of the second MOS transistor; and said cells formed in the main surface region of the substrate differ from each other in a gate couple ratio.

According to a second aspect of the present invention, there is provided a non-volatile semiconductor memory device, comprising:

a semiconductor substrate having a main surface region; and a plurality of cells formed in said main surface region of the substrate;

wherein said plural cells are arranged within a cell section including a plurality of blocks, each cell being formed of first and second MOS transistors each including an active region formed in the main surface region, a gate oxide film formed on the main surface, and a gate portion formed on said gate oxide film, said active region of the first MOS transistor being electrically insulated from said active region of the second MOS transistor, and said gate portion of the first MOS transistor being electrically connected to said gate portion of the second MOS transistor; and said cells arranged within a single block have the same gate couple ratio, and the cells arranged within a certain block differ in the gate couple ratio from the cells arranged within another block.

According to a third aspect of the present invention, there is provided a non-volatile semiconductor memory device, comprising:

a semiconductor substrate having a main surface region; and a plurality of cells formed in said main surface region of the substrate;

wherein said plural cells are arranged within a cell section including a plurality of blocks, and at least one of said blocks includes a sub-block, each cell is formed of first and second MOS transistors each including an active region formed in the main surface region, a gate oxide film formed on the main surface, and a gate portion formed on said gate oxide film, said active region of the first MOS transistor being electrically insulated from said active region of the second MOS transistor, and said gate portion of the first MOS transistor being electrically connected to said gate portion of the second MOS transistor; and said cells arranged within said sub-block differ in a gate couple ratio from the cells arranged within at least one of said blocks other than said sub-block.

According to a fourth aspect of the present invention, there is provided a non-volatile semiconductor memory device, comprising:

a semiconductor substrate of a first conductivity type having a main surface region; and a plurality of cell groups each including a plurality of cells formed in said main surface region of the substrate;

wherein each cell has a CMOS structure and is formed of an active region of said first conductivity type of a first MOS transistor formed in said main surface region of the substrate, an active region of a second conductivity type of a second MOS transistor formed in said main surface region, a gate oxide film formed on the main surface, and a common gate portion of said first and second MOS transistors formed on said gate oxide film, said cell groups differ from each other in a ratio of an overlapping area between the active region and gate portion of the first MOS transistor to an overlapping area between the active region and gate portion of the second MOS transistor, and said cell groups differ from each other in a gate couple ratio.

According to a fifth aspect of the present invention, there is provided a non-volatile semiconductor memory device, comprising:

a semiconductor substrate of a first conductivity type having a main surface region; and a plurality of cells formed in said main surface region of the substrate;

wherein said plural cells are arranged within a cell section including a plurality of blocks, and each cell has a CMOS structure and is formed of an active region of said first conductivity type of a first MOS transistor formed in said main surface region of the substrate, an active region of a second conductivity type of a second MOS transistor formed in said main surface region, a gate oxide film formed on the main surface, and a common gate portion of said first and second MOS transistors formed on said gate oxide film, and said cells formed within the same block are equal to each other in a ratio of an overlapping area between the active region and gate portion of the first MOS transistor to an overlapping area between the active region and gate portion of the second MOS transistor, and said cells formed within one block differ from those formed within another block in a ratio of an overlapping area between the active region and gate portion of the first MOS transistor to an overlapping area between the active region and gate portion of the second MOS transistor, such that the cells within different blocks differ from each other in a gate couple ratio.

Further, according to a sixth aspect of the present invention, there is provided a non-volatile semiconductor memory device, comprising:

a semiconductor substrate of a first conductivity type having a main surface region; and a plurality of cells formed in said main surface region of the substrate;

wherein said plural cells are arranged within a cell section including a plurality of blocks, and at least one of said plural blocks has a sub-block, each cell has a CMOS structure and is formed of an active region of said first conductivity type of a first MOS transistor formed in said main surface region of the substrate, an active region of a second conductivity type of a second MOS transistor formed in said main surface region, a gate oxide film formed on the main surface, and a common gate portion of said first and second MOS transistors formed on said gate oxide film, and said cells formed within said sub-block differ from those formed within at least one of said plural blocks except the sub-block in a ratio of an overlapping area between the active region and gate portion of the first MOS transistor to an overlapping area between the active region and gate portion of the second MOS transistor, such that the cells within different blocks differ from each other in a gate couple ratio.

BRIEF DESCRIPTION OF THE SEVERAL VIEWS OF THE DRAWING

FIG. 1 is a diagram showing the structure of a determining circuit in which a reference apparatus is provided;

FIG. 2 is a schematic diagram showing an example of a semiconductor cell array in which the reference apparatus is applied;

FIG. 3 is a schematic diagram showing a reference array in which the reference apparatus is applied;

FIG. 4 is a characteristic diagram showing the V-I characteristics of the reference apparatus;

FIG. 5 is a characteristic diagram showing the V-I characteristics of a semiconductor cell in which the reference apparatus is applied;

FIG. 10 is a plan view showing another example of the structure of the reference cell used in the reference apparatus;

FIG. 11 is a cross sectional view taken along the line XI—XI of FIG. 10;

FIG. 12 is a cross sectional view taken along the line XII—XII;

FIG. 13 is a plan view showing still another example of the structure of the reference cell used in the reference apparatus of the present invention;

FIG. 15 is a diagram showing a state in which the reference cells of the reference apparatus shown in FIG. 1 and the memory cells are connected to a voltage supply circuit for supplying voltages to these cells;

FIG. 16 is a diagram showing a verifying status of a general memory cell;

FIG. 17 is a diagram illustrating a general verifying status of the reference apparatus of the present invention;

FIG. 20 is a schematic plan view showing a non-volatile semiconductor memory cell device according to another embodiment of the present invention;

FIG. 21 is a cross sectional view showing the first and second MOS type transistors composing each of the memory cells included in the memory device shown in FIG. 20;

DETAILED DESCRIPTION OF THE INVENTION

Figure 6:
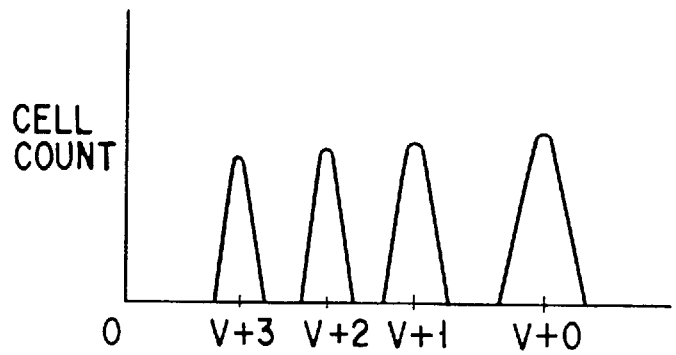
FIG. 6 is a diagram showing an example of the distribution of threshold values of cells in the case of program low.

Embodiments of the present invention will now be described with reference to drawings.

FIG. 1 is a diagram showing the structure of a determining circuit in which a reference apparatus is provided.

This circuit includes a semiconductor cell 1 to be judged, a reference apparatus 2 and a sense amplifier (differential amplifier) 3 connected to these members. The sense amplifier 3 compares a current flowing in the cell 1 and a current flowing in the reference apparatus with each other, under predetermined conditions.

The reference apparatus 2 includes a reference selection circuit 4 and three reference cells 5, 6 and 7 having different threshold values, and either one of the reference cells 5, 6 and 7 is selected by the reference selection circuit 4. These reference cells are semiconductors having the same type of the semiconductor cell 1, and are formed within a cell array.

A plurality of semiconductor cells 1 are arranged to form a cell array 10 as shown in FIG. 2, and the reference cells 5, 6 and 7 form a reference cell array as shown in FIG. 3.

For example, non-volatile semiconductor memories are used as the cells 1, and the same type of semiconductors are used as the reference cells 5, 6 and 7 of the reference apparatus 2, which is used for verification of a program. Further, as shown in FIG. 4, for a verification voltage $V_{d0}$, a cell which stops the execution of the program when the current becomes $I_{d1}$, a cell which stops the execution of the program when the current becomes $I_{d2}$ and a cell which stops the execution of the program when the current becomes $I_{d3}$ are respectively assigned to reference cells 5, 6 and 7. With this structure, a multi-value memory for four reference levels which can be set by a cell which has not been programmed, a cell for $I_{d1}$, a cell for $I_{d2}$, and a cell for $I_{d3}$, can be formed. In other words, the present invention can deal with a multi-value memory without increasing the circuit area, which is caused by using a plurality of sense amplifiers.

FIG. 5 shows the I-d characteristics of a semiconductor cell thus obtained. FIG. 6 shows an example of the distribution of threshold values of cells in the case of the program low.

The term "program low" means a program operation to make the threshold voltage of a memory cell low or the status in which the threshold voltage thereof comes to be low after such a program operation. (See "'94 Symposium on VLSI Technology" pp 97–98.) According to a typical example described in the paper, in the program operation, –8V is applied to the selected word line, and 5V or 0V is applied to the drain. If 5V is applied, electron ejection from the floating gate to the drain occurs, and the threshold voltage of the memory cell becomes low.

FIG. 6 is an example of the case where the program low is carried out after the data have been erased all at once by a time mode without verification. In the case where the verification of $V_{+1}$ is performed with reference to $I_{d1}$, the program level would be of three references, namely, $V_{+1}$ corresponding to $I_{d2}$ and $V_{+2}$ corresponding to $I_{d3}$ in addition to the above.

Next, an example of the structure of a reference cell will now be described.

Figure 7:
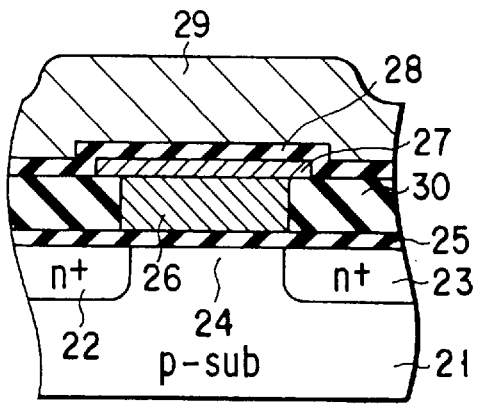
FIG. 7 is a cross sectional diagram showing an example of the structure of a reference cell which is used in the reference apparatus.

A poly-Si cap-type floating gate cell is used in this example. The poly-Si cap-type floating gate cell is discussed in U.S. Pat. No. 4,833,514, and has the structure such as shown in FIG. 7. More specifically, an n-type source 22 and an n-type drain 23 are formed on the main surface of a p-type substrate 21, and a poly-Si floating gate 26 is formed via a gate insulation film 25 on a channel region 24 between the source and drain. Further, a poly-Si cap 27 is formed on the floating gate. A control gate 29 made of poly-Si is formed on the poly-Si cap 27 via an interlevel dielectric layer 28 made of, for example, ONO (oxide-nitride-oxide). An insulation layer 30 is formed on a side of the floating gate 26.

The floating gate 26 is provided so as to cover the channel region 24, and the poly-Si cap 27 formed on the floating gate is formed to have the shape of a hood-roof which covers, partially or entirely, the source 22 and the drain 23, or a part of an element separation region such as a field oxide film. The poly-Si cap 27 serves as a part of the floating gate 26. With the poly-Si cap 27 provided, the capacitance between the floating gate and the control gate can be increased.

The threshold value of a reference cell can be controlled by varying the gate couple ratio, which can be adjusted by changing the capacitance between the floating gate and the control gate. Therefore, in the above-described structure, the threshold value can be changed by varying the area of the poly-Si cap 27, and the area in which the poly-Si cap 27 and the control gate 29 overlap with each other.

Figure 8A:
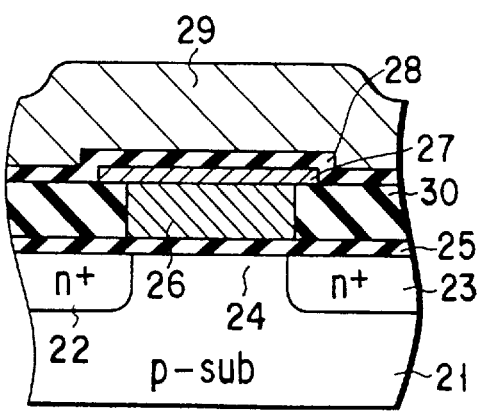
FIGS. 8A to 8C are diagrams showing examples of the reference cell shown in FIG. 7, in which the threshold values are different from each other.
Figure 8B:
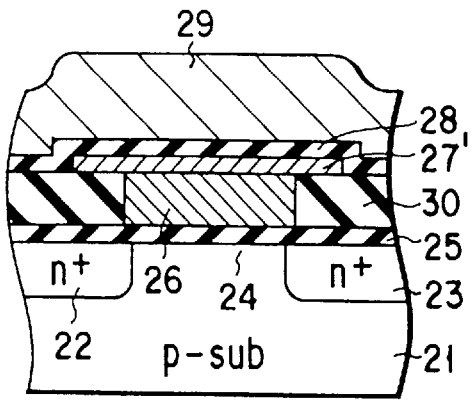
Figure 8C:
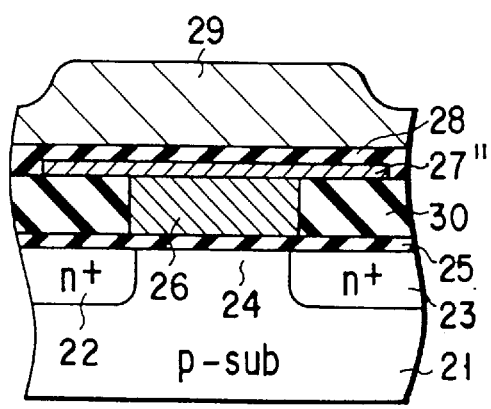

For example, as shown in FIGS. 8A to 8C, by assigning three different areas for the poly-Si cap, the threshold of the reference cell can be set at three reference levels. That is, the reference cell having such a poly-Si cap 27 as shown in FIG. 8A is assigned to the above reference cell 5, and those cells including poly-Si caps 27' and 27", respectively, which are made longer (that is, wider in area) than that of the above, as shown in FIGS. 8B and 8C, are assigned to the reference cells 6 and 7.

An example of the process for the manufacture of these reference cells will now be described with reference to FIGS. 9A to 9D.

First, a gate insulation film made of, for example, silicon oxide, is formed on a main surface of a p-type substrate 21, and a first poly-silicon film for floating gate is formed on it. The first poly-Si film is etched by a conventional photolithography process, and floating gates 26 corresponding to the reference cells are formed. Next, with ion implantation, the source 22 and the drain 23 for each of the reference cells are formed in the main surface of the semiconductor substrate 21 (See FIG. 9A).

Figure 9A:
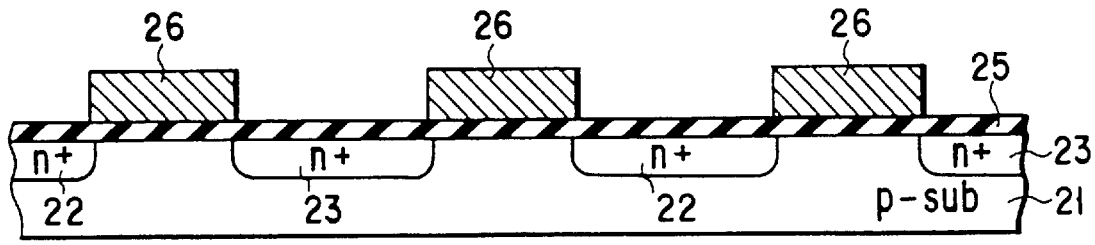
FIGS. 9A to 9D are diagrams illustrating the method of manufacturing a plurality of reference cells having threshold values different from each other.
Figure 9B:
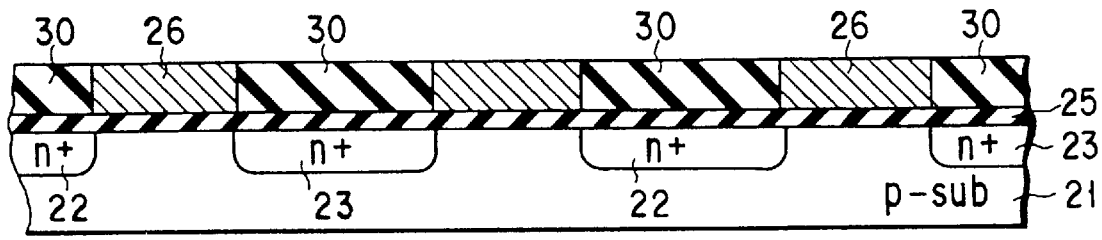
Figure 9C:
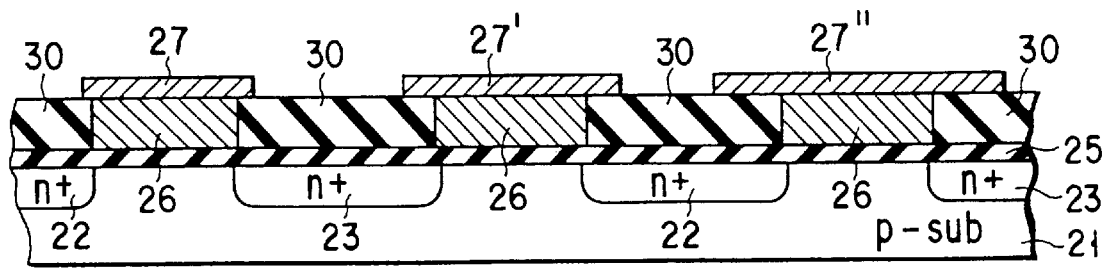

Next, after forming an insulation film on the entire surface, the surface is etched back, thus obtaining an insulation film 30 made of, for example, silicon oxide between the floating gates 26 of adjacent reference cells (see FIG. 9B).

Subsequently, a second poly-Si film is formed, and the second poly-Si film is etched by photolithography with use of a mask having a plurality of opening portions with different lengths (areas) each corresponding to the poly-Si cap of a respective reference cell. Thus, conductive caps 27, 27' and 27" having different areas from each other are formed in the reference cells so as to protrude from the floating gates 26 thereof (see FIG. 9C).

Figure 9D:
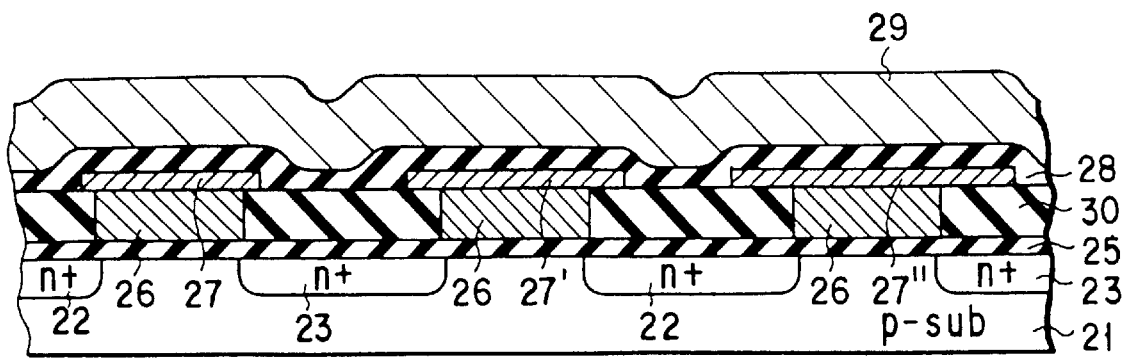

Next, an interlevel dielectric layer 28 made of, for example, ONO (oxide-nitride-oxide) is formed on the insulation film 30 and the poly-Si caps 27, 27', 27", and a third poly-Si film which serves as control gate 29 is formed thereon (see FIG. 9D).

With the above-described process, a plurality of reference cells having threshold values different from each other can be formed.

As described above, in the photolithography step for processing poly-Si caps, a plurality of reference cells having different threshold values can be prepared by use of a very general thin film forming technique and a very general photolithography technique without adding any complicated step, but by merely forming patterns of the poly-Si caps having different lengths (areas) in a mask. More specifically, with a simple process such as to improve a mask by forming patterns having different sizes in the stage of reticle, the reference cells can be formed to have different threshold values.

The above-described cells have a structure in which a poly-Si cap is provided on a floating gate; however, it is also possible that such a cap is not provided, but the floating gate itself is formed to have the function of poly-Si cap. Cells having the above-described structure are illustrated in FIGS. 10 to 12. FIG. 10 is a plan view showing a portion of a cell array consisting of cells having the above-described structure, FIG. 11 is a cross section taken along the line XI—XI indicated in FIG. 10, and FIG. 12 is a cross section taken along the line XII—XII indicated in FIG. 10. As illustrated in these figures, in each of these cells, the floating gate 37 is formed so as to cover a portion of the source 32, a portion of the drain 33, and a portion of the element separation region 36. The structure of each cell is illustrated in detail in FIGS. 11 and 12. As can be seen in these figures, the n-type source 32 and the n-type drain 33 are formed in the main surface of the p-type substrate 31, and the gate insulation film 35 is formed on the channel region 34 provided between the source and drain. A poly-Si floating gate 37 is formed on the gate insulation film 35, and a control gate 39 made of poly-Si is formed on top of that, via an interlevel dielectric layer 38 made of, for example, ONO (oxide-nitride-oxide). These cells are separated from each other by the element separation regions 36.

With regard to the cell having the above-described structure, the threshold value of the cell can be controlled by varying the gate couple ratio, which can be adjusted by changing the capacitance between the floating gate and the control gate. The adjustment of capacitance can be performed by varying the area in which the floating gate 37 and the control gate 39 overlap with each other. In the case where the floating gates are formed, it only suffices if a mask having a plurality of opening portions with different lengths (areas) each corresponding to the floating gate of a respective reference cell, is provided, and there is no need to use other complicated means than the above. The conditions and methods for manufacturing such device, not limited to the reference cell, off course, except for using the above mask may be the same as conventional conditions and methods.

More specifically, first, a gate insulation film made of, for example, silicon oxide, is formed on a p-type substrate 31, and a first poly-Si film which serves as a floating gate is formed on it. Then, with use of a mask having a plurality of opening portions with different lengths (areas) each corresponding to the floating gate of a respective reference cell, the first poly-Si film is etched by photolithography, thus forming floating gates having different areas from one reference cell to another.

After that, a diffusion region, an insulation film between floating gates, an interlevel dielectric film and a control gate are formed by means of conventional steps, and thus a plurality of reference cells having different threshold values can be formed.

The width of the control gate may be changed in order to vary the capacitance between the floating gate and the control gate. This embodiment was discussed in connection with the case where each floating gate is extended in the direction perpendicular to the direction in which the sources and drains are disposed; however, each floating gate may naturally be formed to be extended in the direction in which the sources and drains are arranged.

Next, example of the structure of the reference cell will now be described with reference to FIG. 13. This example was discussed in VLSI symposium 52-A, 1993, and in this example, 1 poly-type EPROM is used as a reference cell of a logic device. This EPROM, needless to say, can be used such a cell as memory cell and redundancy cell, too. In this EPROM, an n-well 42 is formed on a part of a p-type substrate 41. Further, an n$^+$-type source 43 and an n$^+$-type drain 44 are formed in a portion other than the part in which the n-well 42 is formed, and a source 45 and a drain 46 are formed in the part of the n-well 42. On channel regions 47 and 48 formed therebetween, common floating gates 49 or floating gates 49 electrically connected with each other (reference numeral 49*) are formed via a gate oxide film (not shown). In short, the cell has a CMOS structure in which two transistors, namely NMOS and PMOS transistors are combined together. To the source 43 and the drain 44, a voltage Ve is applied from a power supply 51, and the source 45 and the drain 46 are grounded. The NMOS transistor portion serves as a reading transistor, whereas the PMOS transistor portion, especially, the substrate on which the PMOS transistor is formed serves as a control gate portion. It should be noted that the reference numeral 52 is a high-concentration region which serves to make the ground characteristics excellent.

As already described, the non-volatile semiconductor memory device of the present invention includes a memory cell, a redundant cell and a cell in a peripheral circuit region. The gate couple ratio of any of these cells is dependent on the area of the floating gate. The manufacturing method and conditions of the memory device are equal to the conventional method and conditions, except that special masks are used in the present invention for preparing floating gates of different areas. The cells prepared by the method of the present invention have the same structural features except the form of the floating gate. For example, the cells are equal to each other in the channel length, channel width, impurity concentration in the diffusion region, and size of the diffusion region. If a voltage inversely proportional to the gate couple ratio is applied to the control gate in the cell of the particular construction, the same or substantially the same current flows through the cell. Also, if the same voltage is applied to the control gates of cell transistors differing from each other in the gate couple ratio, the cell transistors which are turned on can be distinguished from the transistors which remain to be in the off-state. Also, where the cell transistors are turned on, the magnitude of the current flowing through the channel can be distinguished depending on the cell.

In the above-described 1-poly-type EPROM structure, the gate couple ratio depends upon the implantation amount of the threshold value ion implantation, the thickness of the gate oxide film, and the ratio between the area in which the floating gate and the active region overlap in the control gate portion (PMOS) and the area in which the floating gate and the active region overlap in the reading transistor (NMOS) (to be called the area ratio between the active regions hereinafter). Therefore, by changing these values the gate couple ratio can be varied, and therefore the threshold value can be changed.

As described above, the gate couple ratio can be varied by making the control gate portion (PMOS) and the reading transistor portion (NMOS) different from each other in the area ratio of the active region included therein. The term "cell" used herein represents a general term including a memory cell, a redundant cell, a reference cell, etc. However, the following description is directed to a reference cell as a typical example.

Figure 14A:
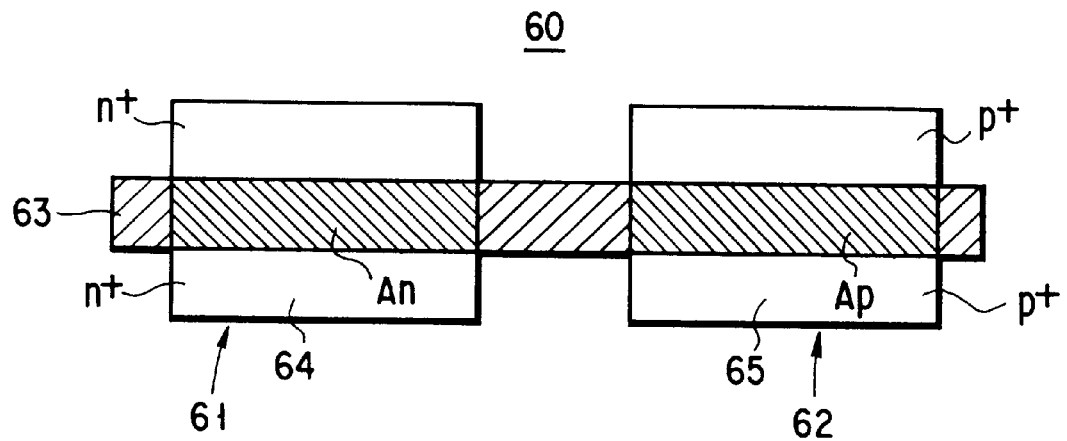
FIGS. 14A and 14B are plan views showing a first reference cell and a second reference cell of the reference apparatus.

Specifically, as seen from FIG. 14A showing a reference cell 60 of a first 1-poly-type EPROM structure, a common floating gate 63 is formed to extend over active regions 64 and 65 of a control gate portion (NMOS) 61 and a reading transistor portion (PMOS) 62, respectively. It should be noted that the gate couple ratio of the reference cell 60 is dependent on an overlapping area ratio Ap/An, where Ap denotes an overlapping area between the active region 65 of the reading transistor portion 62 and the floating gate 63, and An represents an overlapping area between the active region 64 of the control gate portion 61 and the floating gate 63.

Figure 14B:
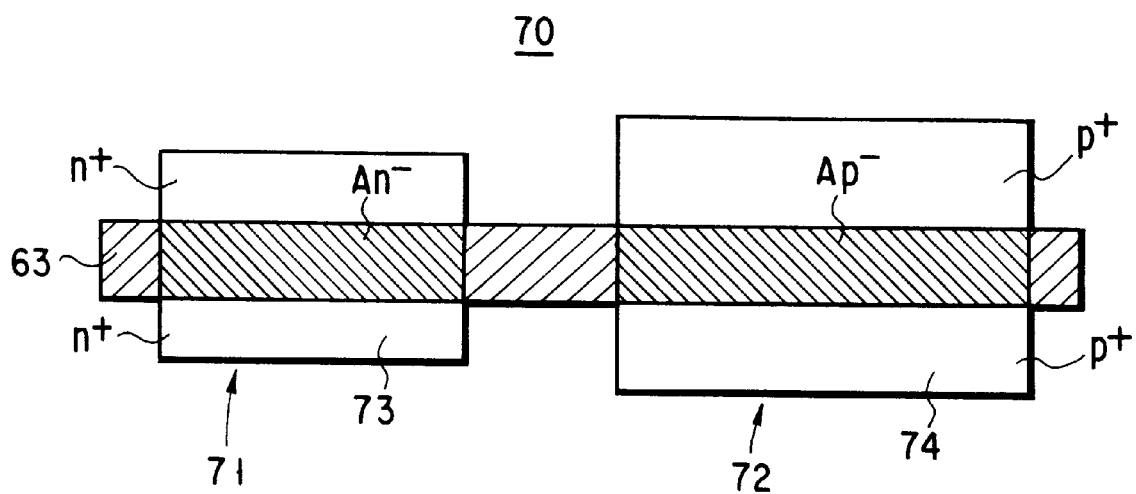

It follows that the gate couple ratio of the reference cell can be controlled by varying the overlapping area ratio, as seen from, for example, FIG. 14B showing a reference cell 70 of a second 1-poly-type EPROM structure. In the reference 70 shown in FIG. 14B, an overlapping area An' between an active region 73 of a control gate portion 71 and the floating gate 63 is made equal to the overlapping area An in the first reference cell 60 shown in FIG. 14A. On the other hand, an overlapping area Ap' in FIG. 14B between an active region 74 of a reading transistor portion 72 and the floating gate 63 is made larger than the overlapping area Ap in the first reference cell 60 shown in FIG. 14A. It follows that the overlapping area ratio Ap'/An' in the second reference cell 70 shown is larger than the ratio Ap/An in the first reference cell 60. It follows that the first and second reference cells 60 and 70 differ from each other in the gate couple ratio. It is also possible to make these cells 60 and 70 different from each other in the threshold value.

In the example described above, the overlapping area Ap' in the second reference cell 70 shown in FIG. 14B is made different from the overlapping area Ap in the first reference cell 70 shown in FIG. 14A. Alternatively, it is possible to make the overlapping areas An and An' in the control gate portions 64, 71 respectively different from each other, while making the overlapping areas Ap and Ap' in the reading transistor portions 65, 72 respectively equal to each other. Further, it is also possible to make the overlapping areas An and An' different from each other, while making the overlapping areas Ap and Ap' different from each other.

Incidentally, the reference cells 40, 60 and 70 shown in FIGS. 13, 14A and 14B, respectively, are of CMOS structure including NMOS forming the control gate portions 61, 71 and PMOS forming the reading transistor portions 62, 72. However, these reference cells 40, 60 and 70 of CMOS structure may be formed to include PMOS forming the control gate portions 61, 71 and NMOS forming the reading transistor portions 62, 72.

Further, the common floating gate 63 is formed of a single conductive layer. However, since it suffices for the gate of the PMOS transistor to be electrically connected to the gate of the NMOS transistor, it is possible for the layer forming the gate to be different from the layer connecting the gates. It is also possible for the layer forming the gate of the PMOS transistor to be different from the layer forming the gate of the NMOS transistor.

The construction exemplified above is directed to a cell of CMOS structure. However, it suffices for the active portion of the PMOS transistor to be electrically insulated from the active portion of the NMOS transistor.

With the above-described construction, in the cases of the technique of changing the threshold value ion implantation and the technique of changing the thickness of the gate oxide film, the number of steps is increased, whereas in the case of the technique of changing the area ratio between the active regions, the number of steps is not increased. Therefore, the area ratio changing technique is preferable. More specifically, the area ratio of the active regions can be changed in steps by varying the areas of the PMOS and NMOS channel regions (gate oxide film area) in the element separation region formation step or varying the area of the floating gate in the floating gate formation step. For changing these areas, a simple technique of improving the photomask as in the above-described example, without increasing the number of steps, is sufficient.

It is obvious that a cell such as reference cell, memory cell and redundancy cell thus manufactured has a good compatibility with regard to the logic device. For example, such cells and the logic device can be manufactured at one time in the same process.

Especially, the reference apparatus of the present invention can be used for a logic device in the following manners. That is, in the case where outputs from a logic circuit or the block thereof are determined in terms of, for example, three levels, an output destination is changed to another in accordance with output levels $I_{d1}$, $I_{d2}$ and $I_{d3}$, or, with regard to circuits A and B having different output levels, the present invention may be used for the circuit A as a reference to check $I_{d1}$-$I_{d2}$, and the circuit B as a reference to check $I_{d3}$-$I_{d2}$. Thus, the present invention can be applied to various versions in accordance with the purpose. Further, the present invention, which is based on the 1-poly-type EPROM structure, is not limited to the CMOS structure, but any type of the structure known as the 1-poly-type EPROM structure can be used in the present invention. And the present invention is not limited to the reference cell, but any type of the cell such as memory cell and redundancy cell can be used here.

Another embodiment of the present invention will now be described.

FIG. 15 shows the state in which each of the reference cells and memory cells of the reference apparatus shown in FIG. 1 is connected to the voltage supply circuit 8 which supplies a voltage to each cell.

The operation of confirming the threshold value of a memory cell after programming or erasing in the non-volatile semiconductor memory device such as a flash memory, is generally called "verification".

In a memory cell, a verification is performed generally with a sufficient margin for the states in which the threshold value is high ($V_{thH}$ and low ($V_{thL}$, and therefore the voltage (verifying voltage) applied to the gate of the memory cell for verification, is changed in accordance with the state to be verified. More specifically, as shown in FIG. 15, for verification of $V_{thH}$, the verifying voltage $V_{GH}$ is applied, whereas for verification of $V_{thL}$, a verifying voltage $V_{GL}$ is larger than $V_{GL}$.

In a reference cell, a constant voltage $V_R$ is applied regardless of the state to be verified, and a cell current $I_R$ which serves as a reference for the determined state, is allowed to flow. More specifically, the verifying current is supplied to a memory cell after programming or erasing, and a current which flows in such a case is compared with $I_R$, thus performing the verification. The voltage $V_D$ applied to the drains of the memory cell and the reference cell are the same.

In the case of the embodiment according to the reference apparatus, the verification is performed, as shown in FIG. 17, at the reference cell current $I_{dn}$ (n=1, 2, 3) with regard to the verifying voltage $V_{Gn}$ (n=1, 2, 3).

Figure 18:
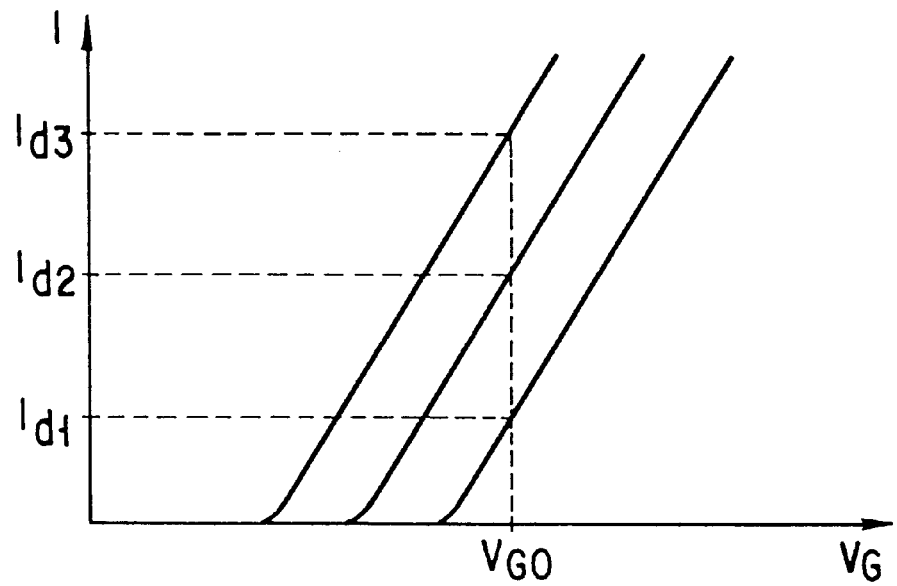
FIG. 18 is a diagram illustrating the verifying method of the present invention, in which the reference apparatus is used.

In the present invention, for the same $V_R$, the reference cells are different from each other in current value $I_{Rn}$. By utilizing such a feature, the verification can be carried out without setting a different verifying voltage for the state of each of the cells as can be seen in FIG. 18. More specifically, the verification is carried out by comparing the cell current of a memory cell at a verifying voltage $V_{GO}$ with the cell current of each reference cell. If $V_{GO}$=$V_R$, a plurality of threshold values can be verified by means of a single gate voltage. In other words, the difference in threshold value between reference cells is utilized as the difference in verifying voltage. In such a case, a plurality of verifying voltages may not be used, and therefore there is no need to provide a divider or dividers for the power supply circuit, thus making it possible to simplify the circuit structure.

Figure 19:
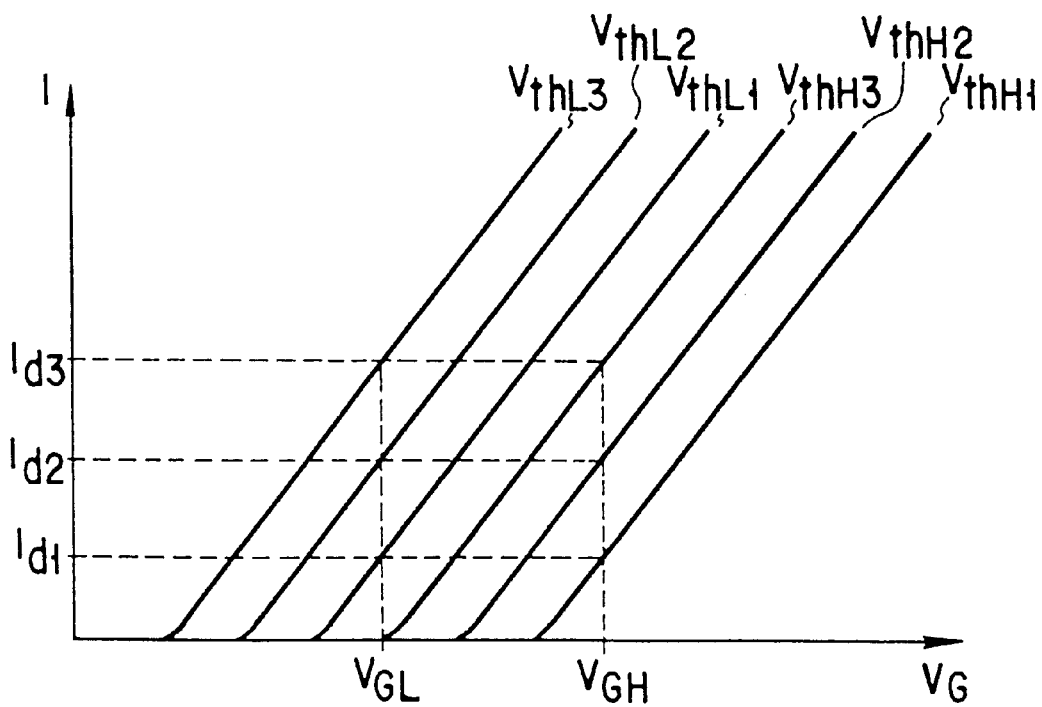
FIG. 19 is a diagram illustrating how the verifying method of the present invention is carried out with use a plurality of verifying voltages.

Further, as can be seen in FIG. 19, by utilizing the above-described feature, a greater number of verifying states, namely, $V_{thL1}$, $V_{thL2}$, $V_{thL3}$, $V_{thH1}$, $V_{thH2}$ and $V_{thH3}$, can be created with use of the plurality of verifying voltages. In this case, the verifying voltage applied to a memory cell is a voltage $V_{GL}$ or $V_{GH}$, whereas $V_R$ is applied to a reference cell.

It should be noted that the flash memory entails the problem of a tail bit. (See "'93 Symposium on VLSI Technology" pp 83–84.) Especially, a low threshold value cell, after electrons are extracted from the floating gate thereof, causes the problem of leakage or the like. As countermeasures to such a problem, techniques including the program-back are presently proposed. "Program-back" is to make the distribution of threshold voltages of memory cells convergent by erasing information of the cells by F-N tunneling and thereafter injecting channel electron induced a valance hot carrier into the floating gate of the cells. (See IEDM 91–307, 11.4.1 to 11.4.4). However, these techniques are not effective in the case of multi-value levels. Therefore, it is necessary to provide a technique for limiting the threshold values of memory cells within a narrow range in the verification. With the conventional method, the threshold value of a memory cell should be controlled for a number of voltage levels, for example, after the memory cell current for the verifying voltage $V_G$ is verified to be $I_R$ or higher, the memory cell current for the verifying voltage $V_G$-$\Delta$ (<$V_G$) is verified to be $I_R$ or less.

In contrast, with use of the reference apparatus of the present invention, the above-mentioned verifying operation will be further simplified. More specifically, the same effect as above can be achieved merely by switching reference cells without varying the verifying voltage. As is clear from FIG. 17, a different reference cell involves a different current level, and therefore, the upper and lower limits of the memory level can be set simply by switching reference cells.

The above-described embodiments are directed to the case where the threshold value of a reference cell is set at three levels; however, the present invention is not limited to the above embodiments. In accordance with necessity, the threshold value can be set at a different number of levels. Further, the type of the reference cells is not limited to those discussed in the embodiments. In other words, in the above embodiments, a stacked gate type reference cell is used for a memory device, and a reference having the 1-poly-type EPROM structure is used for a logic device; however, the present invention is not limited to these embodiments. The type of reference cell can be selected in order for an easy process design.

Further, in the above embodiments, devices having a plurality of threshold values are arranged in the same reference array; however, reference blocks for different threshold levels can be formed.

The 1-poly-type EPROM structure involving transistor structures having different threshold values as shown in FIGS. 13, 14A and 14B can be used in a memory cell included in a non-volatile semiconductor memory device. Naturally, the particular EPROM structure is also applicable to a redundant memory cell corresponding to the memory cell noted above.

FIG. 20 is a plan view schematically showing a non-volatile semiconductor memory device 100 according to another embodiment of the present invention. As shown in the drawing, the non-volatile semiconductor memory device 100 comprises a memory section 101, a redundant cell section 102 and a reference cell section 103.

The memory cell section 101 is divided into a first block 104 and a second block 105. Likewise, the redundant cell section 102 is divided into a first block 106 and a second block 107. Further, the reference cell section 103 is also divided into a first block 108 and a second block 109.

In the first block 104 of the memory cell section 101, a plurality of first type memory cells 111 are formed in a matrix arrangement. Also, a plurality of second type memory cells 112 are formed in a matrix arrangement in the second block 105.

FIG. 21 is a cross sectional view showing the first type memory cell 111 and the second type memory cell 112. Each of the first type memory cell 111 and the second type memory cell 112 has a 1-poly-type EPROM structure. Specifically, an n-well 122 is formed in a p-type substrate 121. An $n^+$-type source region 123 and an $n^+$-type drain region 124 are formed in the substrate 121 outside the n-well 122. Also, a $p^+$-type source region 125 and a $p^+$-type drain region 126 are formed in the n-well 122. Further, a common floating gate 129 or a floating gate portion 129* which electrically connects floating gates 129 with each other is formed over a channel region 127 between the $n^+$-type source and drain regions 123 and 124 and over another channel region 128 between the $p^+$-type source and drain regions 125 and 126. Incidentally, a gate oxide film (not shown) is interposed between the floating gate 129 and the channel region 127 and between the floating gate 129 and the channel region 128. It follows that the memory cells 111 and 112 collectively constitute a CMOS structure consisting of an NMOS and PMOS structures. A voltage Ve is applied from a power source 131 to the source region 123 and the drain region 124, with both the source region 125 and the drain region 126 connected to the ground. It should be noted that the NMOS transistor portion acts as a reading transistor portion, with the PMOS transistor portion acting as a control gate portion. Incidentally, an $n^+$-type region 132 permits improving the ground-connection characteristics.

In the 1-poly-type EPROM structure of the construction described above, the gate couple ratio is dependent on the implantation amount of the threshold value ion implantation, the thickness of the gate oxide film, and the ratio (hereinafter referred to as an area ratio between active regions) between an area of an overlapping portion between the floating gate and an active region in the control gate portion (PMOS), and an area of an overlapping portion between the floating gate an active region in the reading transistor portion (NMOS). Therefore, by changing these values, the gate couple ratio can be varied, and therefore, the threshold value can be changed. Specifically, the threshold value can be changed by varying the gate couple ratio between the first type memory cell 111 and the second type memory cell 112.

Figure 22A:
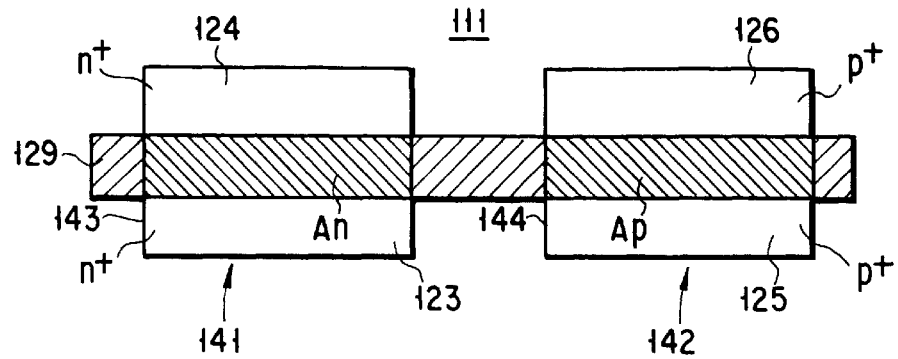
FIGS. 22A and 22B are cross plan views schematically showing the first and second type memory cells included in the device shown in FIG. 20.

To be more specific, FIG. 22A shows that, in the first type memory cell 111, the common floating gate 129 is formed over the active region 143 in the control gate portion (NMOS) 141 and over the active region 144 of the reading transistor portion (PMOS) 142. It should be noted that the gate couple ratio of the first memory cell 111 is dependent on a ratio Ap/An, where An denotes an area of an overlapping portion between the active region 143 of the control gate portion 141 and the floating gate 129, and Ap represents an area of an overlapping portion between the active region 144 of the reading transistor portion 142 and the floating gate 129. In the present invention, an area ratio Ap'/An' in the second type memory cell 112, where An' denotes an area of an overlapping portion between the active region 153 of the control gate portion 151 and the floating gate 129, and Ap' represents an area of an overlapping portion between the active region 154 of the reading transistor portion 152 and the floating gate 129, is made larger than the ratio Ap/An for the first memory cell 111. Specifically, Ap' is made greater than Ap, with An' being set equal to An. As a result, the first memory cell 111 and the second memory cell 112 are made different from each other in the gate couple ratio, making it possible to render these first and second memory cells 111 and 112 different from each other in the threshold value.

Figure 22B:
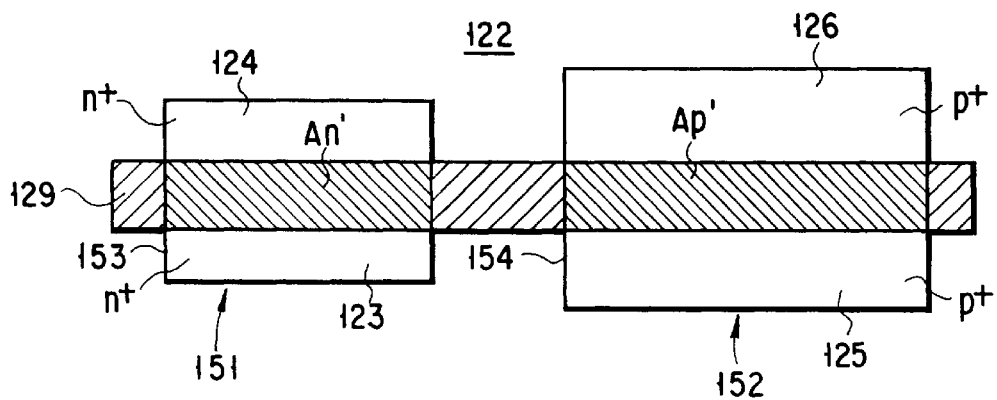

In the embodiment shown in FIGS. 22A and 22B, the overlapping area Ap' in the second memory cell 112 is made different from the overlapping area Ap in the first memory cell 111. Alternatively, it is also possible to make the overlapping area An' for the second memory cell 112 different from the overlapping area An for the first memory cell 111, with Ap' being set equal to Ap. Further, it is possible to make Ap' different from Ap and also make An' different from An.

A plurality of the first type memory cells 111 are also formed in a matrix arrangement in the first block 105 in the redundant cell section 102, as in the memory cell section 101. Further, a plurality of the second memory cells 112 are formed in a matrix arrangement in the second block 106. The cross sectional shapes of these cells are as shown in FIG. 21, like the memory cell.

Further, in the first block 108 of the reference cell section 103, a plurality of reference cells 5, 6, 7 are formed in a matrix arrangement. Likewise, a plurality of reference cells 5', 6', 7' are formed in a matrix arrangement in the second block 109 of the reference cell section 103. These reference cells 5, 6, 7 collectively constitute a first type reference device, with the reference cells 5', 6', 7' collectively constituting a second type reference device. To be more specific, the reference device comprises these reference cells 5, 6, 7, which differ from each other in threshold value, and a reference selecting circuit 4 serving to select one of these reference cells, as shown in FIG. 1.

As already described, each of the reference cells 5, 6, 7 (hereinafter referred to as a first type reference cell) constitutes a 1-poly-type EPROM structure shown in FIG. 13. The first type reference cells 5, 6, 7 differ from each other in threshold value. Specifically, as already described in conjunction with FIGS. 14A and 14B, these cells differ from each other in the area ratio, i.e., a ratio of the active region of the control gate portion to that of the reading transistor portion, so as to make the first type reference cells different from each other in the gate coupling ratio, with the result that the first type reference cells 5, 6, 7 differ from each other in threshold value, as pointed out above. Likewise, the reference cells 5', 6', 7' (hereinafter referred to as a second type reference cell) differ from each other in threshold value.

Further, the first type reference cells 5, 6, 7 are made different from the second type reference cells 5', 6', 7' in the gate couple ratio to allow these first and second type reference cells to conform with the first type memory cell 111 and the second type memory cell 112 described above, respectively, leading to a difference in the threshold value between the first type reference cells and the second type reference cells.

In the non-volatile semiconductor memory device 100 of the construction described above, the area ratio An/Ap in the first memory cell 111 is relatively small, leading to a small gate coupling ratio in each of the first type memory cells 111. As a result, the first memory cell 111 exhibits characteristics similar to those of a read preferential mask ROM.

On the other hand, the second type memory cell 112 has a relatively large area ratio An'/Ap', leading to a large gate couple ratio of each of the second type memory cells 112. As a result, the second type memory cell 112 exhibits excellent program characteristics.

In the non-volatile semiconductor memory device 100 of the construction described above, the first and second type memory cells 111, 112 formed in the first and second blocks 103, 104, respectively, of the memory cell block 101 exhibit characteristics differing from each other. Specifically, the gate couple ratio of the first type memory cell 111 is diminished to enable the first type memory cell 111 to exhibit mask ROM characteristics, with the result that a reading disturbance hardly takes place in the first block 103. On the other hand, the second type memory cell 112 preferentially performs rewriting and, thus, is substantially free from a long-term error like a reading disturbance. It follows that the rewriting characteristics of the second type memory cell 112 can be improved by enlarging the gate couple ratio.

Similarly, the first and second type redundant cells 113, 114 formed in the first and second blocks 106, 107, respectively, of the redundant cell section 102 exhibit features corresponding to the features of the memory cell described above.

As already described, the first type reference cells 5, 6, 7 are formed in the first block 108, with the second type reference cells 5', 6', 7' being formed in the second block 109 of the reference cell section 103. These first and second type reference cells exhibit features corresponding to the above-described features of the memory cell.

Specifically, the first type reference cells 5, 6, 7, which differ from each other in the threshold value, also differ from each other in the gate couple ratio, as already described. This is also the case with the second type reference cells 5', 6', 7'. To be more specific, the gate couple ratios $Cr_1$, $Cr_2$, $Cr_3$ of the first type reference cells 5, 6, 7 collectively constituting a single first type reference device are allowed to meet the relationship of, for example, $Cr_1:Cr_2:Cr_3=1:1.2:1.3$. It should be noted that the gate couple ratios $Cr_1$, $Cr_2$, $Cr_3$ of the first type reference cells 5, 6, 7 are dependent on the area ratios of the active regions. It follows that, in this case, the area ratios $Ar_1$, $Ar_2$, $Ar_3$ of the active regions of the first type reference cells 5, 6, 7 meet the relationship of, for example, $Ar_1:Ar_2:Ar_3=1:1.2:1.3$ in the first type reference device. This is also the case with the second type reference cells 5', 6', 7' collectively constituting a single second type reference device.

Likewise, the first type reference cells 5, 6, 7 differ from the second type reference cells 5', 6', 7' in the gate couple ratio. Specifically, the gate couple ratios of the second type reference cells 5', 6', 7' in the second block 109 are, for example, twice as large as those of the first type reference cells 5, 6, 7 in the first block 108, i.e., a ratio of the gate couple ratios of the first type reference cells to those of the second type reference cells is 1:2. In other words, a ratio of the area ratios of the active regions in the first type reference cells to those in the second type reference cells is 1:2.

It follows that, where the gate couple ratios $Cr_1$, $Cr_2$, $Cr_3$ of the first type reference cells 5, 6, 7 in the first type reference device meet the relationship of, for example, $Cr_1:Cr_2:Cr_3=1:1.2:1.3$, the gate couple ratios $Cr_1'$, $Cr_2'$, $Cr_3'$ of the second type reference cells 5', 6', 7' constituting the second type reference device meet the relationship of $Cr_1':Cr_2':Cr_3'=2:2.4:2.6$. Likewise, where the area ratios $Ar_1$, $Ar_2$, $Ar_3$ of the first type reference cells 5, 6, 7 in the first type reference device meet the relationship of, for example, $Ar_1:Ar_2:Ar_3=1:1.2:1.3$, the area ratios $Ar_1'$, $Ar_2'$, $Ar_3'$ of the active regions of the second type reference cells 5', 6', 7' constituting the second type reference device meet the relationship of $Ar_1':Ar_2':Ar_3'=2:2.4:2.6$. The particular relationship in the gate couple ratio between the first type reference cells 5, 6, 7 and the second type reference cells 5', 6', 7' is equal to the relationship in the gate couple ratio between the first type memory cell 111 and the second type memory cell 112 included in the memory cell section 101.

To reiterate, the reference section 103 includes the first and second type reference devices. Also, the first type reference device comprises a plurality of first type reference cells differing from each other in the threshold value, e.g., the reference cells 5, 6, 7. Likewise, the second reference device comprises a plurality of second type reference cells differing from each other in the threshold value, e.g., the reference cells 5', 6', 7'. Since the presence of these first and second reference devices permits the semiconductor device to achieve diversification of functions using a single sense amplifier, it is possible to prevent increases in the circuit area and chip area while suppressing the manufacturing cost.

On the other hand, in the reference cell section 103, the first type reference cells 5, 6, 7 arranged within the first block 108 differ in characteristics from the second type reference cells 5', 6', 7' arranged within the second block 109, as in the memory cell section 101. As a result, these reference cells are allowed to exhibit features corresponding to those of the memory cells.

In the first and second type memory cells 111, 112 shown in FIGS. 21, 22A, 22B, the control gate portions 141, 151 are formed of NMOS, and the reading transistor portions 142, 152 are formed of PMOS, so as to form CMOS structures. However, the NMOS-PMOS relationship in the first and second type memory cells 111 and 112 can be reversed such that the control gate portions 141, 151 are formed of PMOS, with the reading transistor portions 142, 152 being formed of NMOS.

Figure 23A:
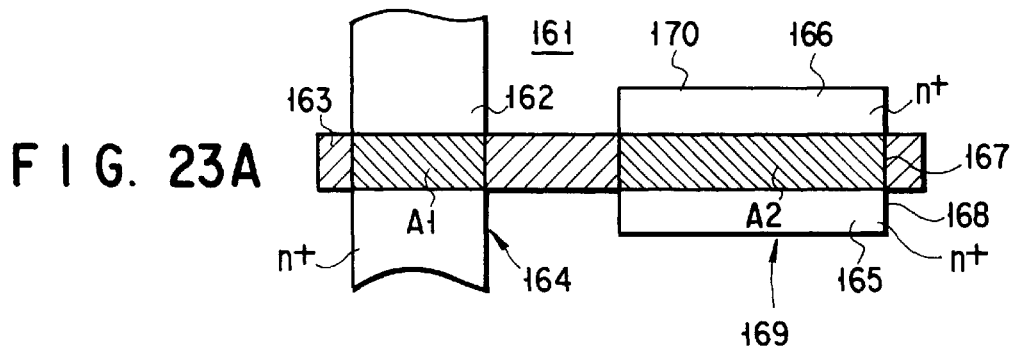
FIGS. 23A and 23B are cross sectional views schematically showing modifications of the first and second type memory cells included in the memory device shown in FIG. 20.
Figure 23B:
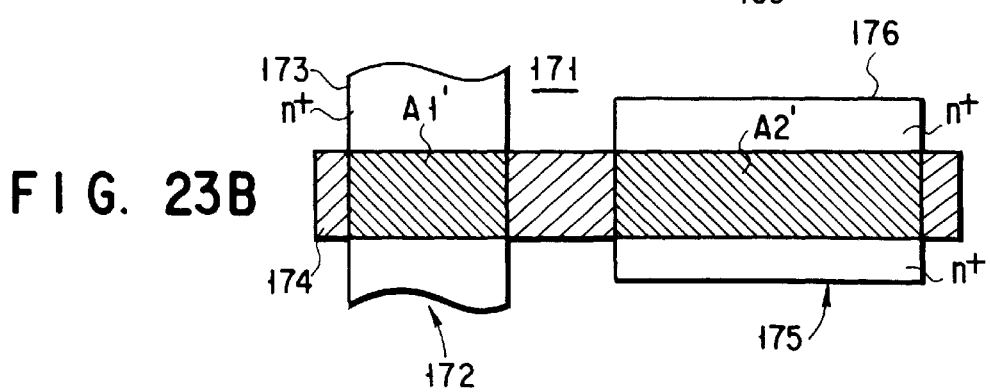

FIGS. 23A and 23B show modifications of the first and second type memory cells. In the modification shown in FIG. 23A, a first type memory cell 161 comprises an $n^+$-type diffusion layer 162 formed in a p-type substrate and a common polycrystalline silicon gate 163 formed on the $n^+$-type diffusion layer 162. Also, a reading transistor portion 169 of a PMOS structure comprises $n^+$-type source and drain regions 165, 166, which are formed apart from each other in the same p-type substrate, a channel region 168 formed between these source and drain regions 165 and 166, and a polycrystalline silicon gate 164, which is common with the control gate portion 164, formed above the channel region 168 with a gate insulating film (not shown) interposed therebetween. These control gate portion 164 and reading transistor portion 169 collectively form the first type memory cell 161.

In the first type memory cell 161 of the construction described above, the gate couple ratio of the first type memory cell 161 is dependent on an area ratio A2/A1, where A1 denotes an area of an overlapping portion between the $n^+$-type diffusion layer 162 of the control gate portion 164 and the polycrystalline silicon gate 163, and A2 represents an area of an overlapping portion between an active region 170 of the reading transistor portion 169 and the polycrystalline silicon gate 163.

As apparent from comparison between FIGS. 23A and 23B, an area ratio A1'/A2' in a second memory cell 171 shown in FIG. 23B, where A1' denotes an area of an overlapping portion between an $n^+$-type diffusion layer 173 of a control gate portion 172 and a polycrystalline silicon gate 174, and A2' represents an area of an overlapping portion between an active region 176 of a reading transistor portion 175 and the polycrystalline silicon gate 174, is made different from the area ratio A2/A1 in the first type memory cell 161 shown in FIG. 23A. As a result, the first and second memory cells 161 and 171 are made different from each other in the gate couple ratio.

In the modification shown in FIGS. 23A and 23B, the first and second type memory cells 161, 171 comprise the $n^+$-type diffusion layers 161, 173 and the reading transistors portions 169, 175 consisting of NMOS transistors. Alternatively, a $p^+$-type diffusion layer and a PMOS transistor can be used for forming the first type memory cell. The description given above for the modification shown in FIGS. 23A and 23B applies as it is to modifications of the first type redundant cell 113, the second type redundant cell 114, the first type reference cells 5, 6, 7 and the second type reference cells 5', 6', 7'.

In this embodiment, a plurality of reference cells are included in each of the first and second type reference devices. However, it is possible for each of these first and second type reference devices to be formed of a single reference cell. In this case, the reference cells in the first block 108 have the same gate couple ratio. Likewise, the reference cells in the second block 109 have the same gate couple ratio. However, the gate couple ratio of the reference cells in the first block 108 differs from that in the second block 109.

In the embodiment described above, the memory cell section 101 is divided into the two blocks 103 and 104. Alternatively, it is possible to divide each of the memory cell section 101, the corresponding redundant cell section 102 and the reference cell section 103 into three or more blocks in view of the required functions of the device. However, the following description is directed to a memory cell as a typical example.

Figure 24:
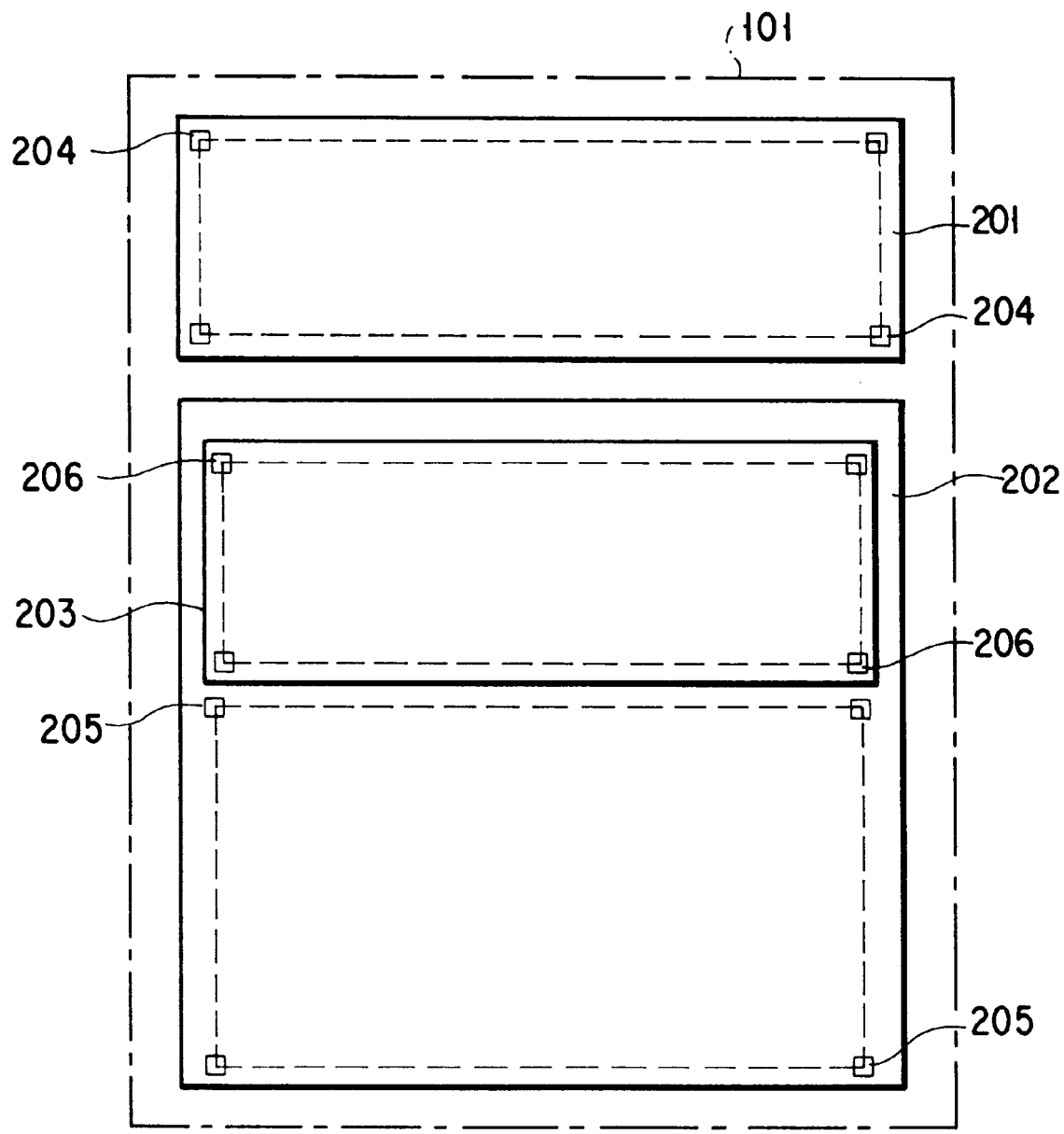
FIG. 24 is a plan view schematically showing a modification of the non-volatile semiconductor device of the present invention.

FIG. 24 shows an additional modification. As shown in the drawing, the memory cell section 101 is divided into first and second blocks 201, 202. It is possible to form a sub-block 203 within the second block 202. Memory cells 204, 205, 206 formed in a matrix array within the first block 201, second block 202 and sub-block 203, respectively, are equal in construction to the first and second memory cells 111, 112 shown in FIGS. 21, 22A, 22B.

The first type memory cell 204 formed within the first block 201 has a relatively small overleaping area ratio Ap/An for obtaining read preferential mask ROM-like characteristics and, thus, has a small gate couple ratio. On the other hand, the second memory cell 205 formed outside the sub-block 203 and within the second block 202 has a relatively large overlapping area ratio Ap'/An' for obtaining rewrite preferential program characteristics and, thus, has a large gate couple ratio.

A third type memory cell 206 formed within the sub-block 203 exhibits characteristics intermediate between those exhibited by the first type memory cell 204 and the second type memory cell 205. It follows that an overlapping area ratio Ap"/An" in the third memory cell 206 is intermediate between those in the first type memory cell 204 and the second type memory cell 205. Further, the gate couple ratio for the third type memory cell 206 is also intermediate between those for the first type memory cell 204 and the second type memory cell 205.

In the modification shown in FIG. 24, the first and second blocks 201 and 202 share a well or a source region and, thus, can be handled as independent regions. Therefore, the conductivity type of the impurity doped in the first and second type memories 204, 205 need not be changed for the first block 201 and the second block 202.

In the modifications described above, MOS type transistor structures are employed in the control gate portions 141, 151 included in the memory cells, as shown in FIGS. 22A and 22B. However, it is possible in this modification to use $n^+$-type diffusion layers 162, 173 for forming the control gate portions 164, 172, as shown in FIGS. 23A and 23B.

Incidentally, the terms "section", "block" and "sub-block", which are depicted as different oblong regions in FIG. 20 or 24, are used herein distinctively as different members. However, these "section", "block" and "sub-block" are common in that a cell group consisting of a plurality of cells such as memory cells, reference cells or redundant cells is arranged therein. It follows that the descriptions of "section", "block" and "sub-block" given in this specification apply to cell groups. What should be noted is that different cell groups can be made different from each other in the gate couple ratio by changing the gate couple ratio of the cell arranged in the cell group.

However, it is possible that the well separation region or the block separation region increases, and the area of the chip accordingly increases. Such a drawback becomes further prominent especially when the size of one block becomes small. In order to avoid this, the memory cell section 101 should be divided into blocks not in the manner that a memory cell group in which the wells or source regions of the cells are used in common, is regarded as one unit, but in the manner that a memory cell group having necessary characteristics is used as one unit. In this way, the well separation region or the block separation region is not increased. In the above-described sub-block 204, the wells and source regions are used in common with those of the second block 202, and therefore the well separation region or the block separation region is not necessary.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

I claim:

1. A semiconductor device, comprising:
    a semiconductor substrate having a main surface region; and
    a plurality of cells formed in said main surface region of the substrate;
    wherein each cell is formed of first and second MOS transistors each including an active region formed in the main surface region, a gate oxide film formed on the main surface, and a gate portion formed on said gate oxide film, said active region of the first MOS transistor being electrically insulated from said active region of the second MOS transistor, and said gate portion of the first MOS transistor being electrically connected to said gate portion of the second MOS transistor; and
    said cells formed in the main surface region of the semiconductor substrate differ from each other in a ratio of an overlapping area between the active region and gate portion of the first MOS transistor to an overlapping area between the active region and gate portion of the second MOS transistor.

2. The semiconductor device according to claim 1, wherein the gate portions of the first and second MOS transistors are formed of a common conductive layer.

3. The semiconductor device according to claim 1, wherein the active regions of the first and second MOS transistors consist of impurity regions of different conductivity types.

4. The semiconductor device according to claim 1, wherein the first and second MOS transistors are complementary to each other to enable each cell to have a CMOS structure.

5. The semiconductor device according to claim 2, wherein said cell is a non-volatile cell including source/drain regions formed in the main surface region of the substrate, a gate oxide film formed on the main surface, a floating gate formed on said gate oxide film, an intermediate gate oxide film formed on said floating gate, and a control gate formed on said intermediate gate oxide film, said active region of the first MOS transistor functions as said source/drain regions, said common conductive layer acting as the gate portions of the first and second MOS transistors functions as said floating gate, and said semiconductor substrate having at least the active region of the second MOS transistor formed therein functions as said control gate.

* * * * *